United States Patent
Martens (10) Patent No.: US 11,237,197 B1
(45) Date of Patent: Feb. 1, 2022

(54) METHOD AND SYSTEMS FOR MAKING IMPROVED QUASI-LINEAR/NONLINEAR MEASUREMENTS ON INTEGRATED ANTENNA ARRAYS AND ELEMENTS

(71) Applicant: ANRITSU COMPANY, Morgan Hill, CA (US)

(72) Inventor: Jon Martens, San Jose, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 0 days.

(21) Appl. No.: 16/570,842

(22) Filed: Sep. 13, 2019

Related U.S. Application Data (60) Provisional application No. 62/731,035, filed on Sep. 13, 2018.

(51) Int. Cl.
*G01R 27/28* (2006.01)
(52) U.S. Cl.
CPC .................................. *G01R 27/28* (2013.01)
(58) Field of Classification Search
CPC ..... G01R 27/28; H04W 24/06; H04W 72/042
See application file for complete search history.

(56) References Cited

U.S. PATENT DOCUMENTS

| | | | |
|---|---|---|---|
| 5,801,525 A | 9/1998 | Oldfield |
| 5,812,039 A | 9/1998 | Oldfield |
| 5,909,192 A | 6/1999 | Finch |
| 5,977,779 A | 11/1999 | Bradley |
| 6,049,212 A | 4/2000 | Oldfield |
| 6,291,984 B1 | 9/2001 | Wong |
| 6,316,945 B1 | 11/2001 | Kapetanic |
| 6,331,769 B1 | 12/2001 | Wong |
| 6,496,353 B1 | 12/2002 | Chio |
| 6,504,449 B2 | 1/2003 | Constantine |
| 6,509,821 B2 | 1/2003 | Oldfield |
| 6,525,631 B1 | 2/2003 | Oldfield |
| 6,529,844 B1 | 3/2003 | Kapetanic |
| 6,548,999 B2 | 4/2003 | Wong |
| 6,650,123 B2 | 11/2003 | Martens |

(Continued)

OTHER PUBLICATIONS

Akmal, M. et al., "An Enhanced Modulated Waveform Measurement System for the Robust Characterization of Microwave Devices under Modulated Excitation", Proceedings of the 6th European Microwave Integrated Circuits Conference, © 2011, Oct. 2011, Manchester, UK, pp. 180-183.

(Continued)

*Primary Examiner* — Akm Zakaria
(74) *Attorney, Agent, or Firm* — Tucker Ellis LLP (57) ABSTRACT

A system and method for making improved measurements of integrated antenna arrays utilizes vector network analyzer (VNA) and a calibrated receive-side system comprising two antennae, dual reflectometers coupled to the two antennae for match correction, a wide band intermediate frequency (IF) strip which connects the receive-side system to the input ports of the VNA, an air gap which separates the receive-side system form the DUT, and a stepmotion baffle configure to be inserted into the air gap to modify antenna coupling. The system and method enable measurement of noise characteristics of the DUT including nonlinear effects of transmitter element coupling between the plurality of transmitter elements within an antenna array.

20 Claims, 3 Drawing Sheets

(56) References Cited

U.S. PATENT DOCUMENTS

| | | |
|---|---|---|
| 6,665,628 B2 | 12/2003 | Martens |
| 6,670,796 B2 | 12/2003 | Mori |
| 6,680,679 B2 | 1/2004 | Stickle |
| 6,700,366 B2 | 3/2004 | Truesdale |
| 6,700,531 B2 | 3/2004 | Abou-Jaoude |
| 6,714,898 B1 | 3/2004 | Kapetanic |
| 6,766,262 B2 | 7/2004 | Martens |
| 6,832,170 B2 | 12/2004 | Martens |
| 6,839,030 B2 | 1/2005 | Noujeim |
| 6,882,160 B2 | 4/2005 | Martens |
| 6,888,342 B2 | 5/2005 | Bradley |
| 6,894,581 B2 | 5/2005 | Noujeim |
| 6,917,892 B2 | 7/2005 | Bradley |
| 6,928,373 B2 | 8/2005 | Martens |
| 6,943,563 B2 | 9/2005 | Martens |
| 7,002,517 B2 | 2/2006 | Noujeim |
| 7,011,529 B2 | 3/2006 | Oldfield |
| 7,016,024 B2 | 3/2006 | Bridge |
| 7,019,510 B1 | 3/2006 | Bradley |
| 7,054,776 B2 | 5/2006 | Bradley |
| 7,068,046 B2 | 6/2006 | Martens |
| 7,088,111 B2 | 8/2006 | Noujeim |
| 7,108,527 B2 | 9/2006 | Oldfield |
| 7,126,347 B1 | 10/2006 | Bradley |
| 7,173,423 B2 | 2/2007 | Buchwald |
| 7,284,141 B2 | 10/2007 | Stickle |
| 7,304,469 B1 | 12/2007 | Bradley |
| 7,307,493 B2 | 12/2007 | Feldman |
| 7,509,107 B2 | 3/2009 | Bradley |
| 7,511,577 B2 | 3/2009 | Bradley |
| 7,521,939 B2 | 4/2009 | Bradley |
| 7,545,151 B2 | 6/2009 | Martens |
| 7,683,602 B2 | 3/2010 | Bradley |
| 7,683,633 B2 | 3/2010 | Noujeim |
| 7,705,582 B2 | 4/2010 | Noujeim |
| 7,746,052 B2 | 6/2010 | Noujeim |
| 7,764,141 B2 | 7/2010 | Noujeim |
| 7,872,467 B2 | 1/2011 | Bradley |
| 7,924,024 B2 | 4/2011 | Martens |
| 7,957,462 B2 | 6/2011 | Aboujaoude |
| 7,983,668 B2 | 7/2011 | Tiernan |
| 8,027,390 B2 | 9/2011 | Noujeim |
| 8,058,880 B2 | 11/2011 | Bradley |
| 8,145,166 B2 | 3/2012 | Barber |
| 8,156,167 B2 | 4/2012 | Bradley |
| 8,159,208 B2 | 4/2012 | Brown |
| 8,169,993 B2 | 5/2012 | Huang |
| 8,185,078 B2 | 5/2012 | Martens |
| 8,278,944 B1 | 10/2012 | Noujeim |
| 8,294,469 B2 | 10/2012 | Bradley |
| 8,305,115 B2 | 11/2012 | Bradley |
| 8,306,134 B2 | 11/2012 | Martens |
| 8,410,786 B1 | 4/2013 | Bradley |
| 8,417,189 B2 | 4/2013 | Noujeim |
| 8,457,187 B1 | 6/2013 | Aboujaoude |
| 8,493,111 B1 | 7/2013 | Bradley |
| 8,498,582 B1 | 7/2013 | Bradley |
| 8,538,350 B2 | 9/2013 | Varjonen |
| 8,593,158 B1 | 11/2013 | Bradley |
| 8,629,671 B1 | 1/2014 | Bradley |
| 8,630,591 B1 | 1/2014 | Martens |
| 8,666,322 B1 | 3/2014 | Bradley |
| 8,699,970 B2 * | 4/2014 | Lorenzen ............... H04B 17/13 455/114.3 |
| 8,706,044 B2 * | 4/2014 | Chang .................. H04W 24/06 455/67.11 |
| 8,718,586 B2 | 5/2014 | Martens |
| 8,760,148 B1 | 6/2014 | Bradley |
| 8,816,672 B1 | 8/2014 | Bradley |
| 8,816,673 B1 | 8/2014 | Barber |
| 8,884,664 B1 | 11/2014 | Bradley |
| 8,903,149 B1 | 12/2014 | Noujeim |
| 8,903,324 B1 | 12/2014 | Bradley |
| 8,942,109 B2 | 1/2015 | Dorenbosch |
| 9,103,856 B2 | 8/2015 | Brown |
| 9,103,873 B1 | 8/2015 | Martens |
| 9,153,890 B2 | 10/2015 | Warwick |
| 9,176,174 B1 | 11/2015 | Bradley |
| 9,176,180 B1 | 11/2015 | Bradley |
| 9,210,598 B1 | 12/2015 | Bradley |
| 9,239,371 B1 | 1/2016 | Bradley |
| 9,287,604 B1 | 3/2016 | Noujeim |
| 9,331,633 B1 | 5/2016 | Robertson |
| 9,337,941 B2 | 5/2016 | Emerson |
| 9,366,707 B1 | 6/2016 | Bradley |
| 9,455,792 B1 | 9/2016 | Truesdale |
| 9,560,537 B1 | 1/2017 | Lundquist |
| 9,571,142 B2 | 2/2017 | Huang |
| 9,588,212 B1 | 3/2017 | Bradley |
| 9,594,370 B1 | 3/2017 | Bradley |
| 9,606,212 B1 | 3/2017 | Martens |
| 9,680,245 B2 | 6/2017 | Warwick |
| 9,685,717 B2 | 6/2017 | Warwick |
| 9,696,403 B1 | 7/2017 | Elder-Groebe |
| 9,733,289 B1 | 8/2017 | Bradley |
| 9,753,071 B1 | 9/2017 | Martens |
| 9,768,892 B1 | 9/2017 | Bradley |
| 9,860,054 B1 | 1/2018 | Bradley |
| 9,964,585 B1 | 5/2018 | Bradley |
| 9,967,085 B1 | 5/2018 | Bradley |
| 9,977,068 B1 | 5/2018 | Bradley |
| 10,003,453 B1 | 6/2018 | Bradley |
| 10,006,952 B1 | 6/2018 | Bradley |
| 10,064,317 B1 | 8/2018 | Bradley |
| 10,116,432 B1 | 10/2018 | Bradley |
| 2014/0327429 A1 * | 11/2014 | Ziomek ................. H04B 17/16 324/96 |
| 2016/0344490 A1 * | 11/2016 | Foegelle ................ H04B 17/11 |
| 2018/0294896 A1 * | 10/2018 | Foegelle ............ H04B 17/0087 |

OTHER PUBLICATIONS

Cunha, Telmo R. et al., "Characterizing Power Amplifier Static AM/PM with Spectrum Analyzer Measurements", IEEE © 2014, 4 pages.

Fager, Christian et al., "Prediction of Smart Antenna Transmitter Characteristics Using a New Behavioral Modeling Approach" IEEE ® 2014, 4 pages.

Fager, Christian et al., "Analysis of Nonlinear Distortion in Phased Array Transmitters" 2017 International Workshop on Integrated Nonlinear Microwave and Millmetre-Wave Circuits (INMMiC), Apr. 20-21, 2017, Graz, Austria, 4 pages.

Martens, J. et al., "Towards Faster, Swept, Time-Coherent Transient Network Analyzer Measurements" 86th ARFTG Conf. Dig., Dec. 2015, 4 pages.

Martens, J., "Match correction and linearity effects on wide-bandwidth modulated AM-AM and AM-PM measurements" 2016 EuMW Conf. Dig., Oct. 2016, 4 pages.

Nopchinda, Dhecha et al., "Emulation of Array Coupling Influence on RF Power Amplifiers in a Measurement Setup", IEEE © 2016, 4 pages.

Pedro, Jose Carlos et al., "On the Use of Multitone Techniques for Assessing RF Components' Intermodulation Distortion", IEEE Transactions on Microwave Theory and Techniques, vol. 47, No. 12, Dec. 1999, pp. 2393-2402.

Ribeiro, Diogo C. et al., "D-Parameters: A Novel Framework for Characterization and Behavioral Modeling of Mixed-Signal Systems", IEEE Transactions on Microwave Theory and Techniques, vol. 63, No. 10, Oct. 2015, pp. 3277-3287.

Roblin, Patrick, "Nonlinear RF Circuits and Nonlinear Vector Network Analyzers; Interactive Measurement and Design Techniques", The Cambridge RF and Microwave Engineering Series, Cambridge University Press © 2011, entire book.

Rusek, Fredrik et al., "Scaling Up MIMO; Opportunities and challenges with very large arrays", IEEE Signal Processing Magazine, Jan. 2013, pp. 40-60.

Senic, Damir et al., "Estimating and Reducing Uncertainty in Reverberation-Chamber Characterization at Millimeter-Wave Frequencies", IEEE Transactions on Antennas and Propagation, vol. 64, No. 7, Jul. 2016, pp. 3130-3140.

(56) References Cited

OTHER PUBLICATIONS

Senic, Damir et al., "Radiated Power Based on Wave Parameters at Millimeter-wave Frequencies for Integrated Wireless Devices", IEEE © 2016, 4 pages.

* cited by examiner

METHOD AND SYSTEMS FOR MAKING IMPROVED QUASI-LINEAR/NONLINEAR MEASUREMENTS ON INTEGRATED ANTENNA ARRAYS AND ELEMENTS

PRIORITY CLAIM

The present application claims priority to U.S. Provisional Application 62/731,035 entitled METHOD AND SYSTEMS FOR MAKING IMPROVED QUASI-LINEAR/ NONLINEAR MEASUREMENTS ON INTEGRATED ANTENNA ARRAYS AND ELEMENTS filed Sep. 13, 2018 which application is incorporated herein by reference in its entirety.

TECHNICAL FIELD

The present invention relates generally to methods of measuring noise characteristics of a device under test (DUT) and instruments that measure noise characteristics of a DUT, including the nonlinear effects of transmitter element coupling.

BACKGROUND

Quasi-linear and nonlinear measurements (including, but not limited to, AM-AM, AM-PM, amplitude modulation (AM), phase modulation (PM), intermodulation distortion, and harmonic generation) on transmitters/receivers/transceivers are routine for connectorized or otherwise accessible radios and a high level of correction for absolute power, mismatch, measurement receiver distortion and other factors is possible. With the increasingly common integration of antenna structures with radios, this is more problematic and more critical, particularly in array situations where one element of an integrated radio may influence the linearity of a neighboring element.

An additional complication is that these measurements must increasingly be done in a modulated sense since the linearity of a device under test (DUT) can also be strongly affected by the excitation signal. Using brute force measurement techniques, measurement errors can exceed multiple dB on intermodulation distortion and dB/deg-scale errors on AM-AM and AM-PM measurements are routine. This can lead to poor models of radio performance, erroneous design decisions or potentially incorrect qualification results.

An object of this invention is to provide improved measurement systems and methods for connectorized or otherwise accessible radios having radios with integrated antenna structure. The systems and methods reduce measurement errors thereby improving models of radio performance allowing for accurate design decisions and qualification results.

These and further objects and features of the present invention are described in the detailed specification and drawings below.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout.

In the following description, numerous specific details are set forth to provide a thorough description of the invention. However, it will be apparent to those skilled in the art that the invention may be practiced without these specific details. In other instances, well-known features have not been described in detail so as not to obscure the invention.

An embodiment of system and methods in accordance with the present invention can be applied to improve the functionality of vector network analyzer (VNA) or VNA-like measurements (including multi-channel vector signal analyzers (VSAs)) by using match and receiver corrections in a free-space sense with modulated signals to enable more accurate quasi-linear measurements of radios integrated with antennae. The measurement setup of interest includes a number of highly linear receivers (for example, the 3743A module available from ANRITSU®) feeding wider-IF digitizers to capture the modulated data of interest with minimal instrumentation-induced distortion. A calibration process to deal with path mismatch and frequency response and modest correction of non-DUT nonlinearities is also part of the measurement.

Embodiments of the present invention comprise an improved method and system for measuring quasilinear quantities on a modulated basis for radios with integrated antennae. Integrated radios incorporated one or more transceivers and antennae into a signal device. Reference nodes within the device may not be available for direct measurement (e.g. between the transceiver an antenna). Embodiments of the present invention include the use of highly linear wideband receivers, a relatively wideband digitizing Intermediate Frequency (IF) and calibration processes to remove mismatch and frequency response effects both over modulation bandwidth and over carrier frequency range. Embodiments can include over the air (OTA) testing of quasi-linear quantities with modulated measurements that are vector and match-corrected.

In a an embodiment, the present invention provides a system and method for making improved measurements of integrated antenna arrays utilizes vector network analyzer (VNA) and a calibrated receive-side system comprising two antennae, dual reflectometers coupled to the two antennae for match correction, a wide band intermediate frequency (IF) strip which connects the receive-side system to the input ports of the VNA, an air gap which separates the receive-side system form the DUT, and a stepmotion baffle configure to be inserted into the air gap to modify antenna coupling. The system and method enable measurement of noise characteristics of the DUT including nonlinear effects of transmitter element coupling between the plurality of transmitter elements within an antenna array.

Embodiments of the present invention utilize match corrected receiver and phase calibrations and continuous data acquisition by a VNA to enable recovery of interpretable measurement data which can lead to better characterization of integrated radios including analysis of problems such as neighboring element-induced distortion in such radios. The systems and methods overcome errors in conventional free-space measurements of quantities such as AM-AM, AM-PM and intermodulation at mm-wave frequencies for integrated device with somewhat wideband waveforms.

Radios integrated with antennae make conventional measurements and their corrections much more difficult. Adding in the modulated excitation requirement compounds the problem. As transmit chains become more integrated with antennae, characterization and validation has become more complex due to the addition of path effects and the inaccessibility of convenient referencing nodes. Coupling of neighboring chains in an array (due to the path environment or native coupling within the array) can change the linearity of the system semi-dynamically. The air channel between the DUT has loss, phase and match variations even within the modulation bandwidth (as well as over carrier frequency ranges) and coupling from nearby antenna elements can radically alter the quasi-linear behavior of the DUT.

The present invention describes improved measurement systems and methods for connectorized or otherwise accessible radios having radios with integrated antenna structure. The systems and methods reduce measurement errors thereby improving models of radio performance allowing for accurate design decisions and qualification results.

Embodiments of the present invention make use of a highly linear receiver (receive-side system) to avoid distorting the measurement and, particularly for mm-wave frequencies, the receiver can include a front-end that is small enough to support a measuring array in some cases (e.g., to pick up multiple polarizations or for beam steering and to not be an inordinate generator of reflections in itself). The receiver further includes a sufficiently wide IF to support the modulated characterization.

Figure 1:
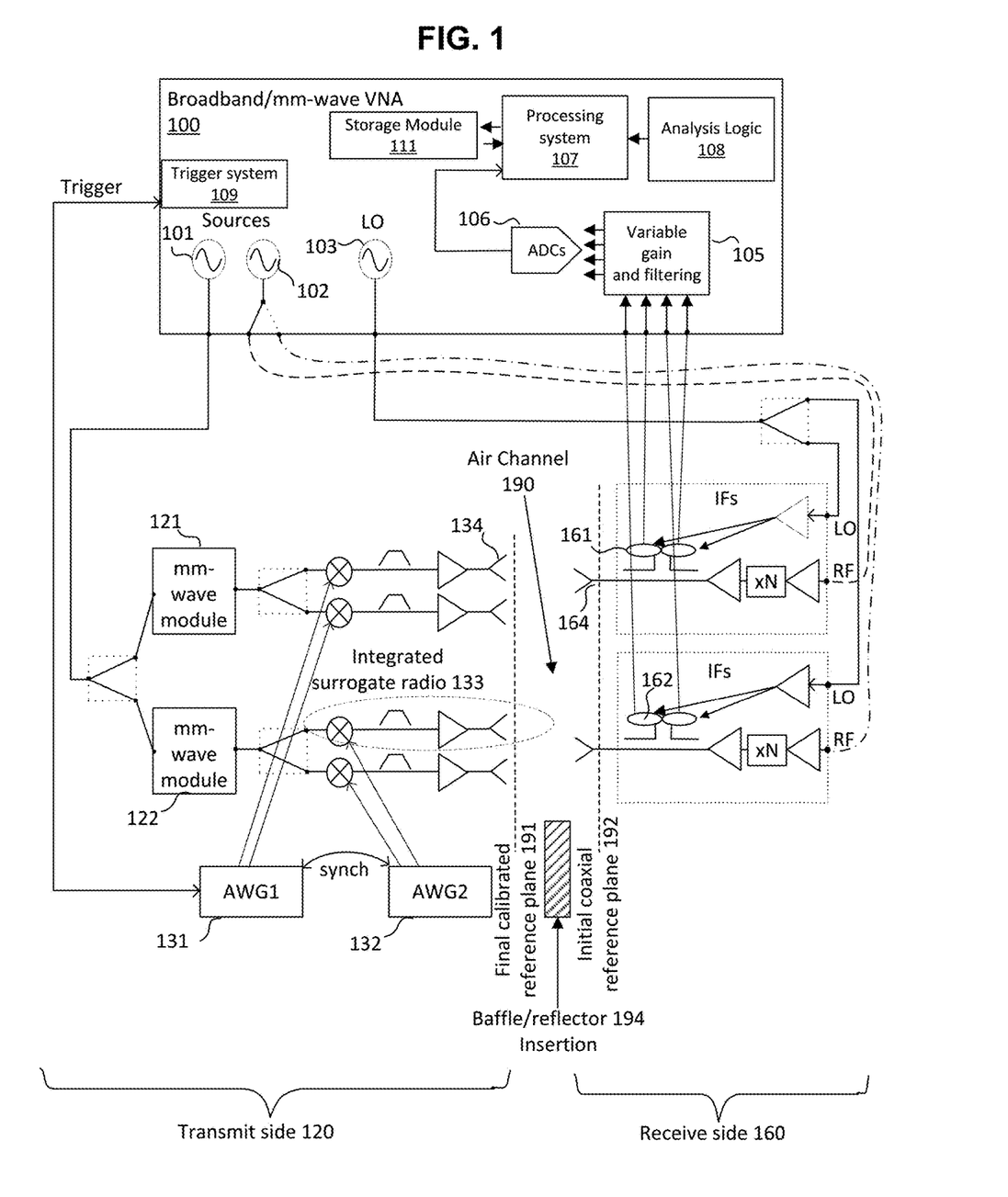
FIG. 1 is a partial circuit diagram of a measurement setup according to an embodiment.

FIG. 1 is a partial circuit diagram of a measurement setup is shown here where the transmitters used an AWG and mm-wave LO as inputs. The receiver has integrated reflectometers and a wideband IF strip, in accordance with an embodiment.

A basic measurement structure for an embodiment of a system and method is shown in FIG. 1 and uses a broadband/mm-wave Vector network Analyzer VNA (125 GHz coverage) 100 as the base engine, although many other configurations are possible. VNA 100 includes RF sources 101, 120 and LO source 103. Input signals into VNA 100 pass through variable gain and filtering module 105 and are then digitized by multi-channel ADCs 106. The digitized signals can then be processed by processing system 107 to perform measurements and characterization of devices under test (DUT) such as integrated radios utilizing analysis logic 108. 6. The VNA is configured to receive IF signals from the wide band intermediate frequency (IF) strip, amplify and filter the IF signals, digitize the Received IF signal into digital signal data, and store the digital signal data in the storage medium 111 for analysis. The VNA comprises a processing system 107 which can initiate and perform a sweep of frequency or power independent of data acquisition and IF signal data can be is acquired continuously and for each step of the sweep. Signals are output from sources 101, 102 and LO 103 to the transmit-side 120 and receive-side 160 systems.

VNA 100 is connected to both the transmit side 120 and receive side 160 of the measurement setup. The measurement setup is shown in FIG. 1 where the transmitters use AWG1 131 and AWG2 132 and mm-wave LO from source 101 of VNA 100 via mm wave modules 121 and 122 as inputs. The receiver has integrated reflectometers 161, 162 and a wideband IF strip. The wideband IF strip provides input to VNA 100 which amplifies, filters, and digitizes the received signals. The transmit side was analogous to the receive side other than having a surrogate radio block 133 inserted between the antennas 123 and the mm-wave module. For the measurements discussed below with respect to FIGS. 2A, 2B, 3 and 4, stationary multi-sines were used as stimulus. The trigger coherence would have permitted the measurements to occur with non-stationary modulated waveforms as well. The calibrated reference planes 191 and 192 are shown and discussed below.

The transmit side 120 uses mm-wave modules 121, 122 to generate a fundamental LO. Synchronized arbitrary waveform generators (AWG) create the data payload (modulation) which have, for example, 50-150 MHz of bandwidth (limited by the AWGs rather than the upconversion blocks). A mixer/filter/antenna block forms the surrogate for an integrated radio 133. While the LO could be considered part of the radio, the separation makes no difference as far as the measurement and calibration procedures are concerned. In application, the integrated radio DUT would be used in place of this surrogate on the transmit side.

The system of FIG. 1 utilizes a highly linear receiver (receive-side system) to avoid distorting the measurement and, particularly for mm-wave frequencies, the receiver can include a front-end that is small enough to support a measuring array in some cases (e.g., to pick up multiple polarizations or for beam steering and to not be an inordinate generator of reflections in itself). The receive-side 160 uses very similar mm-wave modules but the details are made more explicit in FIG. 1 to show the presence of the dual reflectometers 161, 162 needed for match correction. The sources 101, 102 (and LO 103) in the base VNA 100 are independently tuned. The IF system has 200 MHz of bandwidth and digitization is coherent with the triggering process 109. For setup simplicity, the antennae used are waveguide horns. Measurements are made by the VNA made at various frequencies in V and E bands. The receiver bandwidth was entirely limited by the Rx antennae 164. The air channel 190 was altered by inserting stepmotion baffles 194 in the transmit paths between the transmit side antennae 134 and receive side antennae 164 (to alter antenna coupling).

In accordance with an embodiment, the mismatch inherent in the air channel 190 (including antennae) can be calibrated out (along with the frequency response and phase variation) using a calibration transmitter and a dual-coupled receiver (2nd tier calibration). The dual coupling is inherent to capturing match information and the correction as a whole is important for an accurate receiver calibration. This calibration improves accuracy in AM-AM, AM-PM, intermodulation distortion, ACPR, harmonics and other measurements of the transmitter. Using a 2×2 MIMO array at V/E-band (with ~50-150 MHz modulation bandwidth) as an evaluation vehicle, measurement improvements enabled detection of AM-AM changes on the scale of tenths of a dB and AM-PM changes on the scale of degrees that were invisible otherwise as shown below.

The measurement system of FIG. 1 is calibrated. A four port VNA calibration is performed coaxially using copies of the modules in the receiver locations of FIG. 1 and a power calibration is performed at the coaxial planes. A calibration horn antenna was used in each transmit location (with calibrated drive) to compute the path frequency response (magnitude and phase) for each mechanical channel configuration and move the reference planes of the receiver calibration to the Tx plane. If a reverberation chamber approach is used, the calibration and measurement steps would normally be done as ensemble averages. During the free-space measurement, both reference and test reflectometers in the receiver module are used for match correction (by introducing a concept parallel to load match used in conventional VNA calibrations).

For the phase measurement, as discussed earlier, there are choices. With the acquisition method employed here (and only the need for consistent phase within a sweep), the corrected receiver calibration within the continuous acquisition suffices. If a phase-randomizing transmitter is being tested, then there would be an additional synchronizing/calibration step.

As in similar connectorized measurements, a grid calibration frequency plan is used to cover both the desired carrier frequency range and the modulation bandwidth range for each carrier point. For this work, 1000 carrier frequency points (60-100 GHz) were used and, at each of those points, 50 points over the 200 MHz modulation bandwidth were used. Based on the length scale of the measurement setup (including paths), periodicity was on the order of 100 MHz so this density was adequate.

After calibrations are performed, the system can be used for measurements of the integrated radio (DUT or surrogate). The desired quasi-linear variables and the effects of coupling within the transmit structure can be measure and analyzed. For the AM-AM measurement, the drive power to the transmitter is changed using the AWG level. The horizontal input power axis is in normalized terms. In the measurements, the 'A' side denotes the transmitter to which the input power is being varied (so one would expect a vaguely linear relationship between input and output levels for the 'A' side). The 'B' side denotes the orthogonal polarization path to which there is some coupling. In the absence of coupling and transmitter linearity issues, there should be no dependence of the 'B' side on 'A' side input power. However, real world results illustrate coupling as shown herein. The results are based on averaging of three tones of a ten-tone multisine in two different parts of the overall spectrum (lower and upper extremes; to be labeled zones 1 and 2, respectively).

Combined, characterization of coupling effects on element linearity is possible. This characterization can benefit system design. For example, design changes can be made to reduce or eliminate coupling in the integrated radio. Even if the elements of the integrated radio could be disassembled into connectorizable radios (so that traditional techniques could be used), the coupled element type of characterization would be difficult to emulate. The present systems and methods avoid the need for such emulation.

Figure 2A:
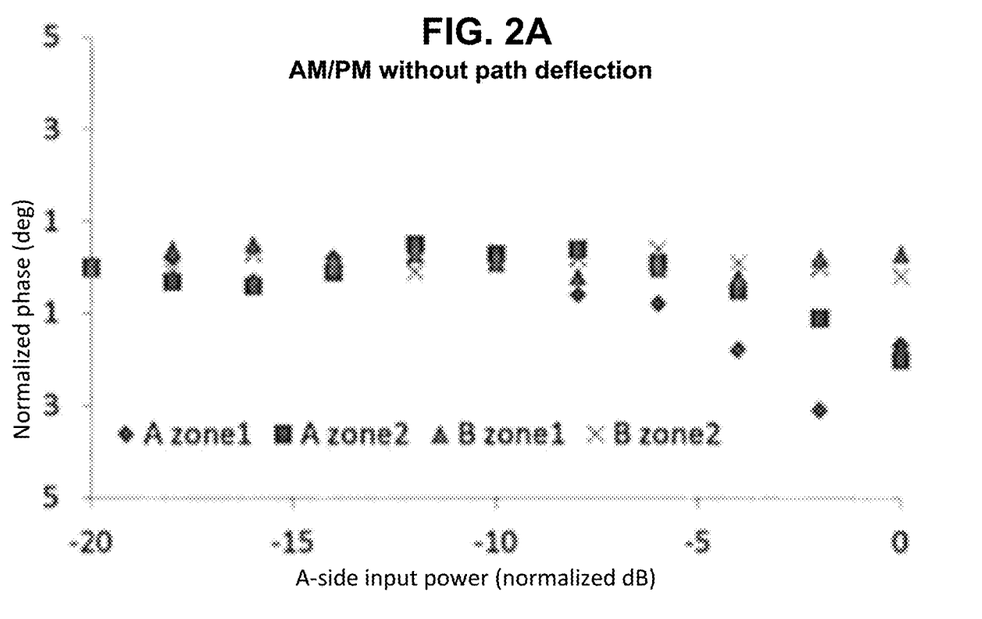
FIGS. 2A and 2B illustrate AM-PM measurement without path distortions and with coupling-enhancing deflection according to an embodiment.
Figure 2B:
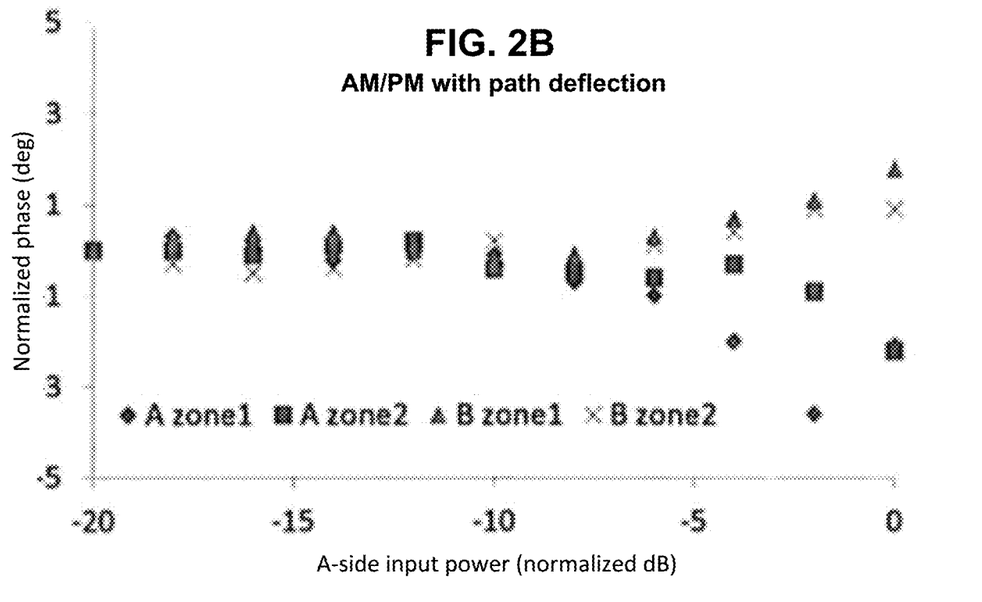

FIGS. 2A and 2B illustrate AM-PM measurement without path distortions (FIG. 2A) and with coupling-enhancing deflection (FIG. 2B). In FIGS. 2A and 2B, the AM-PM measurements (@76 GHz) are plotted. FIG. 2A is without path distortions and FIG. 2B is with coupling-enhancing deflection.

Referring to FIGS. 2A and 2B, as a gross demonstration of the effect, consider the variation of output phase of two transmitters A and B as the input power to A is changed (cross-polarized antennae on these two radios). Ideally B should show no dependence on the power of A, but, as shown, if the channel is changed to increase element coupling (with path deflection), the B phase starts to respond to changes in A. This illustrated coupling effects in integrated radios. Such coupling effects complicate characterization of such integrated radios. The systems and methods of the present invention enable accurate characterization of the integrated radios by VNA 100 despite such complications.

For AM-PM measurements, the phase was additively normalized to 0 (based on low power result) for all measurements. No 'B' side phase distortion was noted when the path was undisturbed but increased to 2 degrees at the highest power level with path deflection. Zone 1 refers to the tone at the lower end of the bandwidth and zone 2 refers to the tone at the upper extreme. AM-AM deviation from a nominal specified value at 0 dBm drive as a function of frequency was measured for a heavily multi-path-dominated channel configuration. As seen from the uncorrected data in FIG. 3, it is difficult to draw many conclusions about the behavior with respect to carrier frequency or in-band frequency. Of interest, however, is the variation of AM-AM and AM-PM at some fixed power with different channel configurations and here the corrections have merit.

Figure 3:
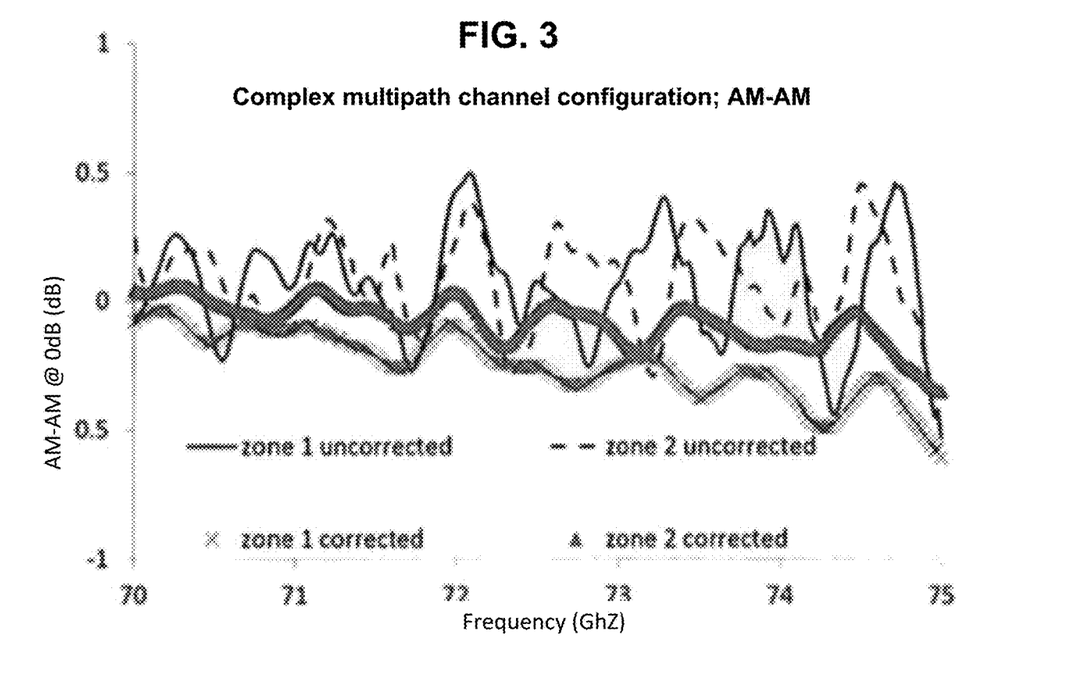
FIG. 3 illustrates the AM-AM level at a particular drive level is plotted vs. carrier frequency according to an embodiment.

The corrected results are also in FIG. 3 and, within the context of an estimated uncertainty of 0.2 dB; suggesting increasing distortion with carrier frequency and at the upper end of the modulation bandwidth relative to the lower end. While not conclusive in itself, the amplifier used in the transmitter was measured in a connectorized setup and both its own third order intercept point and its load pull sensitivity (of output power) degraded at 75 GHz relative to 70 GHz. The AM-PM distortion also was elevated (to 3-4 degrees) at 75 GHz as was consistent with the connectorized measurements of the amplifier alone. The uncorrected scatter in AM-PM data over the carrier sweep range was on the order of 5 degrees and the corrected AM-PM uncertainty was ~2 degrees as discussed previously.

FIG. 3 illustrates the AM-AM level at a particular drive level is plotted vs. carrier frequency for two different zones within the modulation bandwidth. Without the correction, trends with both in-band and carrier frequency would have been difficult to detect. An aspect of this invention is to increase the accuracy of this class of measurement to enable the creation of better transmitter models and to better understand the distortions in a transmitter array.

Referring to FIG. 3, it is desired to learn how AM-AM (measured as the output level deviation from that expected from a given input level change) for different carrier frequencies and for different positions in the modulation bandwidth (denoted by zones 1 and 2). With a simple normalization-only correction and classical receivers, it was not possible to discern any trends. With the hardware and calibrations of the invention it is possible to see an increasing AM-AM, with carrier frequency and a higher level in zone 1 of the modulation bandwidth as opposed to zone 2, beyond the repeatability limit.

Intermodulation distortion is also of interest and an offset multisine stimulus was used (~100 MHz total bandwidth for each transmitter: 6 MHz spacing and 2 MHz offset). The path deflection again increased distortion due to increased coupling and this increase did have some noticeable frequency response within the bandwidth. To make the effects of the correction more clear, the intermodulation products only (first few on each side) are also plotted in FIG. 4 using only a bulk normalization base calibration. The differences reached as high as 5 dB for this measurement example.

Figure 4:
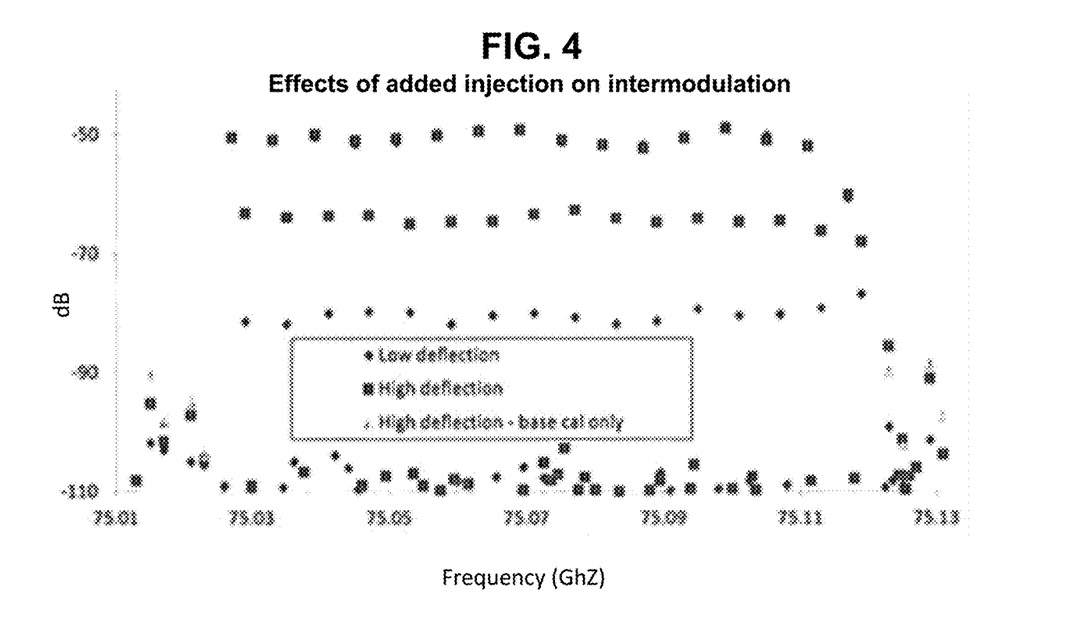
FIG. 4 illustrates multisine intermodulation measurements with and without a coupling-inducing deflector according to an embodiment.

FIG. 4 illustrates multisine intermodulation measurements with and without a coupling-inducing deflector in the channel path are plotted here at 75 GHz. The intermodulation products for the high deflection case are also plotted using only a simplified base calibration. Referring to FIG. 4, the effect of the correction is also visible in an intermodulation measurement. Here a multisine stimulus is used to excite the transmitters (the 16 tone pairs in the middle of FIG. 4) and the intermodulation products (at the extreme edges of the plot) were evaluated and the air channel was again changed. The use of the hardware and corrections described in this invention revealed multiple dB changes in the intermodulation product levels that would not have been detected without the process discussed. This is important in assessing the model for the integrated radio or for demonstrating its performance.

In some embodiments, the present invention includes a computer program product which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

What is claimed is:

1. A system for obtaining measurements for a device under test (DUT) comprising:
    a four port vector network analyzer (VNA) including a storage medium, and a controller for controlling a sweep, signal sources, local oscillators (LOs) and an analog-to-digital converter (ADC);
    wherein the four port VNA is configured to provide two output ports and two input ports wherein the two output ports of the VNA are connected to the DUT;
    a calibrated receive-side system comprising two antennae;
    dual reflectometers coupled to the two antennae of the receive-side system for match correction;
    a wide band intermediate frequency (IF) strip which connects the receive-side system to the two input ports of the VNA;
    an air gap which separates the receive-side system from the DUT; and
    a stepmotion baffle configured to be inserted into the air gap to modify antenna coupling;
    wherein the system is configured to measure noise characteristics of the DUT.

2. The system of claim 1, wherein:
    the DUT is an integrated radio comprising a plurality transmitter elements; and
    wherein the system is configured to measure noise characteristics of the DUT including nonlinear effects of transmitter element coupling between the plurality of transmitter elements within the DUT.

3. The system of claim 1, further comprising a plurality of synchronized arbitrary waveform generators to create data payload for the DUT.

4. The system of claim 1, wherein the receive-side system is calibrated using a calibration antenna in each transmit location of The DUT to compute path frequency response for each transmit location.

5. The system of claim 1, wherein the system is configured to measure noise characteristics of the DUT including amplitude modulation-amplitude modulation (AM-AM) and amplitude modulation-phase modulation (AM-PM).

6. The system of claim 1, wherein the VNA is configured to receive IF signals from the wide band intermediate frequency (IF) strip, amplify and filter the IF signals, digitize the received IF signal into digital signal data, and store the digital signal data in the storage medium for analysis.

7. The system of claim 1, wherein the VNA comprises a processing system configured to initiate and perform a sweep of frequency or power independent of data acquisition and wherein signal data is acquired continuously and for each step of the sweep.

8. A method for obtaining measurements for a device under test (DUT) comprising:
    providing a four port vector network analyzer (VNA) including a storage medium, and a controller for controlling a sweep, signal sources, local oscillators (LOs) and an analog-to-digital converter (ADC);
    wherein the four port VNA is configured to provide two output ports and two input ports wherein the two output ports of the VNA are connected to the DUT;
    providing a calibrated receive-side system comprising two antennae, dual reflectometers coupled to the two antennae for match correction, a wide band intermediate frequency (IF) strip which connects the receive-side system to the two input ports of the VNA, an air gap which separates the receive-side system from the DUT, and a stepmotion baffle configured to be inserted into the air gap to modify antenna coupling; and
    operating the VNA and the receive-side system to measure noise characteristics of the DUT.

9. The method of claim 8, wherein:
    the DUT is an integrated radio comprising a plurality transmitter elements; and
    wherein operating the VNA and the receive-side system to measure noise characteristics of the DUT comprises operating the VNA and the receive-side system to measure noise characteristics of the DUT including nonlinear effects of transmitter element coupling between the plurality of transmitter elements within the DUT.

10. The method of claim 8, further comprising:
    providing a plurality of synchronized arbitrary waveform generators; and
    using the plurality of synchronized arbitrary waveform generators to create data payload for the DUT.

11. The method of claim 8, further comprising:
    calibrating the receive-side system using a calibration antenna in each transmit location of the DUT; and
    computing path frequency response for each transmit location.

12. The method of claim 8, wherein operating the VNA and the receive-side system to measure noise characteristics of the DUT comprises operating the VNA and the receive-side system to measure noise characteristics of the DUT including amplitude modulation-amplitude modulation (AM-AM) and amplitude modulation-phase modulation (AM-PM).

13. The method of claim 8, further comprising:
    operating the VNA to receive IF signals from the wide band intermediate frequency (IF) strip, amplify and filter the IF signals, digitize the received IF signal into digital signal data, and store the digital signal data in the storage medium for analysis.

14. The method of claim 8, further comprising:
operating the VNA to initiate and perform a sweep of frequency or power independent of data acquisition and wherein signal data is acquired continuously and for each step of the sweep.

15. A method for obtaining measurements for integrated radio comprising a plurality of transmitter elements, the method comprising:
providing a four port vector network analyzer (VNA) including a storage medium, and a controller for controlling a sweep, signal sources, local oscillators (LOs) and an analog-to-digital converter (ADC);
wherein the four port VNA is configured to provide two output ports and two input ports wherein the two output ports of the VNA are connected to a plurality of transmitter elements of the integrated radio;
providing a calibrated receive-side system comprising two antennae, dual reflectometers coupled to the two antennae for match correction, a wide band intermediate frequency (IF) strip which connects the receive-side system to the two input ports of the VNA, an air gap which separates the receive-side system from the integrated radio, and a stepmotion baffle configured to be inserted into the air gap to modify antenna coupling; and
operating the VNA and the receive-side system to measure noise characteristics of the integrated radio including nonlinear effects of the antenna coupling between the plurality of transmitter elements within the integrated radio.

16. The method of claim 15 further comprising:
providing a mm-wave module connected to one of the two output ports of the VNA wherein the mm-wave module is connected to the integrated radio and used to drive the plurality of transmitter elements.

17. The method of claim 15, further comprising:
providing a plurality of synchronized arbitrary waveform generators; and
using the plurality of synchronized arbitrary waveform generators to create data payload for the integrated radio.

18. The method of claim 15, wherein operating the VNA and the receive-side system to measure noise characteristics of the integrated radio comprises operating the VNA and the receive-side system to measure noise characteristics of the integrated radio including amplitude modulation-amplitude modulation (AM-AM) and amplitude modulation-phase modulation (AM-PM).

19. The method of claim 15, further comprising:
operating the VNA to receive IF signals from the wide band intermediate frequency (IF) strip, amplify and filter the IF signals, digitize the received IF signal into digital signal data, and store the digital signal data in the storage medium for analysis.

20. The method of claim 15, further comprising:
operating the VNA to initiate and perform a sweep of frequency or power independent of data acquisition and wherein signal data is acquired continuously and for each step of the sweep.

\* \* \* \* \*